United States Patent [19]

Huang et al.

[11] Patent Number: 5,747,914
[45] Date of Patent: May 5, 1998

[54] DRIVING CIRCUIT FOR MULTISECTIONAL PIEZOELECTRIC TRANSFORMERS USING PULSE-POSITION-MODULATION/PHASE MODULATION

[75] Inventors: Jin Huang, Hoffman Estates; Pallab Midya, Schaumburg; Brian M. Mancini, Carol Stream, all of Ill.

[73] Assignee: Motorola Inc., Schaumburg, Ill.

[21] Appl. No.: 795,530

[22] Filed: Feb. 5, 1997

[51] Int. Cl.[6] .................................. H01L 41/08
[52] U.S. Cl. .................. 310/318; 310/319; 310/366
[58] Field of Search ........................... 310/316, 318, 310/317, 319, 358, 359, 366

[56] References Cited

U.S. PATENT DOCUMENTS

| | | | |
|---|---|---|---|
| 2,830,274 | 4/1958 | Rosen | 310/359 |
| 3,700,936 | 10/1972 | Shimizu | 310/319 |
| 5,329,200 | 7/1994 | Zaitsu | 310/318 |
| 5,341,061 | 8/1994 | Zaitsu | 310/318 |
| 5,365,141 | 11/1994 | Kawai et al. | 310/359 |
| 5,391,001 | 2/1995 | Rupert et al. | 374/130 |
| 5,440,195 | 8/1995 | Ohnishi et al. | 310/359 |
| 5,463,266 | 10/1995 | Fukuoka et al. | 310/359 |

*Primary Examiner*—Mark O. Budd
*Attorney, Agent, or Firm*—Brian M. Mancini

[57] ABSTRACT

A transformer circuit (10) for a piezoelectric transformer (12) having dual inputs which can piezoelectrically interfere with one another to provide adjustable output gain. The transformer circuit (10) provides two pulse-position-modulated input signals (18, 20) which are substantially identical waveforms, but being phase shifted from one another. When the signals (18, 20) constructively interfere maximum gain is achieved. When the two signals (18, 20) destructively interfere minimum gain is achieved. The waveforms may be of any arbitrary type including square, sine, triangle, sawtooth or irregular. Both input signals (18, 20) are at a resonant frequency of the piezoelectric transformer (12) and have a fifty percent duty cycle so as to always provide highest efficiency within the transformer (12). In addition, when the two input signals (18, 20) destructively interfere with each other piezoelectrically, the input impedance of the transformer (12) rises so as to lessen power dissipation within the transformer (12) which subsequently reduces adverse heating effects.

19 Claims, 6 Drawing Sheets

DRIVING CIRCUIT FOR MULTISECTIONAL PIEZOELECTRIC TRANSFORMERS USING PULSE-POSITION-MODULATION/PHASE MODULATION

FIELD OF THE INVENTION

The invention relates generally to the field of electrical power circuits for transformers, and in particular, to a transformer circuit using pulse-position-modulation/phase modulation for driving multisectional piezoelectric transformers.

BACKGROUND OF THE INVENTION

Generally, piezoelectric transformers are used in power supplies for televisions, photocopiers, LCD backlights and the like. Prior art piezoelectric transformers are based on the well known Rosen design (U.S. Pat. No. 2,830,274). These prior art high voltage transformer designs are of a piezoelectric ceramic plate which includes a driving section and a driven section which each have different polarizations. The different polarizations provide for the voltage transformation in these designs. However, these designs have several drawbacks. First, the input and output impedances for a piezoelectric transformer is dependent on the physical configuration of the transformer. Second, the voltage gain of the transformer is dependent on the input and output impedance. Third, the efficiency of the transformer is also dependent on the input and output impedance.

All of the above design dependencies result in less than optimum transformer designs. For example, a customer will typically specify what gain is required for a particular application having a specific load impedance. The transformer designer must then design a transformer for the requested gain, plus scale the transformer dimensions to present the proper impedance, while also providing the maximum efficiency. Since all of these parameters are codependent it may not be possible to provide a satisfactory transformer design. In particular, best efficiency for a transformer generally occurs for a narrow range of load impedances, and best gain for a transformer may occur outside of this narrow range. Therefore, it has proven difficult to provide piezoelectric transformers with adjustable gain.

Adjustable gain is a common requirement in several applications. For example, in LCD backlights for laptop computers, a constant battery voltage is provided (usually 3–5 volts) and the driving transformer is required to have adjustable gain in order to provide adjustable screen brightness.

Prior methods having attempted to provide adjustable again so as to make this parameter independent of the other design parameters. Two of these prior art methods for providing adjustable gain have included pulse frequency modulation and pulse width modulation. Pulse frequency modulation provides adjustable gain as a function of driving the transformer at frequencies that are off resonance. The further off resonance the transformer is driven the less output amplitude is produced and the less gain it has. The off resonance condition has the disadvantage of operating the transformer at less than optimum efficiencies because the piezoelectric transformer is not being driven at a resonance point. Moreover, because the transformer is a high Q device, the resonant frequency peak is very narrow and the slope is very steep making it difficult to control the working point on the slope or keep it on the same side of the slope, and therefore the gain is adversely affected. In addition, the transformer frequency will drift as the operating temperature changes.

A driver circuit in pulse frequency modulation uses an error signal between the desired output and the actual output to change the frequency. The change in frequency required depends on a slope of the gain versus phase curve. However, this slope varies both in magnitude and polarity which makes a feedback scheme difficult to control. Stability and convergence can only be maintained if the slope polarity is constrained. Moreover, the high Q nature of the transformer and frequency variations with temperature and loading further complicate the operation of such a driver circuit.

Pulse width modulation provides adjustable output voltage as a function of the duty cycle of the driving signal. Changing the duty cycle of the driving signal from a nominal 50% duty cycle lowers the amplitude of the fundamental frequency which reduces the output voltage at that frequency.

Pulse width modulation has the disadvantage of diverting power to harmonic frequencies which reduces efficiency and introduces unwanted signals, also.

The need exists for a new piezoelectric transformer which: provides independently adjustable voltage gain, is driven at a resonance frequency of the piezoelectric transformer, is driven with a nominal 50% duty cycle to minimize energy diversion into harmonic frequencies, operates at maximum efficiency, and can be manufactured at a low cost.

BRIEF DESCRIPTION OF THE DRAWINGS

FIG. 2A is a side view of a typical singularly polarized piezoelectric transformer and a graphical representation showing an even harmonic operational mode, in accordance with the present invention;

FIG. 2B is a side view of a typical modified Rosen type piezoelectric transformer and a graphical representation showing an odd harmonic operational mode, in accordance with the present invention;

DETAILED DESCRIPTION OF THE PREFERRED EMBODIMENT

Figure 1:
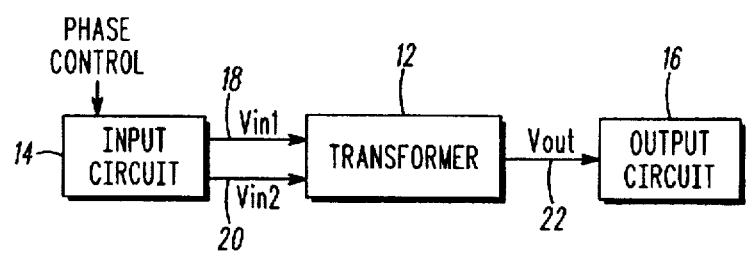
FIG. 1 is a block diagram of a first embodiment of a simplified transformer circuit for a piezoelectric transformer, in accordance with the present invention.

The present invention is a transformer circuit using pulse-position-modulation (PPM) or alternatively phase-modulation (PM) to modulate driving signals to a multisectional piezoelectric transformer. The term multisectional refers to a configuration where there are more than one coupled input or output sections of the transformer. In one embodiment of the present invention, a piezoelectric transformer is configured to have at least two independent but interfering driving or input sections coupled to at least one driven or output section. The phase relationship of the input signals determines the gain of the output signal.

Alternatively, a single driving or input section may be used to drive at least two driven or output sections. In this case, signals produced from the output sections are individually phase shifted in an external circuit and then electrically combined or summed, in a differential amplifier or phase comparator for example, to provide an adjustable gain output corresponding to the relative difference in phase of the output signals. In this alternative embodiment the voltage gain is manipulated electrically instead of being provided inherently by interfering piezoelectric vibrations. The advantage of this alternative is that the input circuit can be designed to self-resonate with the input section of the transformer independently of the rest of the circuitry while a phase shifter independently adjusts the output voltage.

In a first embodiment of the present invention, a transformer circuit produces at least two driving signals. The signals have an adjustable phase lag between them, and preferably substantially identical waveshapes and amplitudes. The driving signals are applied to at least two respective independent and interfering multisectional inputs of a piezoelectric transformer. Each input section generates an independent piezoelectric vibration which interferes with the vibrations generated by the other input sections. As the phase difference between the vibrations of driving sections is adjusted from substantially in-phase to substantially out-of-phase, the piezoelectric vibrations from the driving sections of the transformer range from substantially complete constructive interference, which gives maximum gain output, to substantially complete destructive interference, which gives minimum gain output. This embodiment has the advantage of driving the piezoelectric transformer to operate at an efficient, substantially constant resonant frequency and a substantially constant 50% duty cycle while providing widely adjustable gain output. Optionally, the driving circuit can be kept at resonance by using the transformer characteristic in a feedback loop.

An embodiment of the transformer circuit using pulse-position-modulation includes a switching circuit providing substantially square-wave driving signals. The advantage of using a switching circuit is that switching circuits have a high power efficiency. An embodiment of the transformer circuit using phase-modulation includes an oscillating circuit used to provide substantially sine-wave driving signals. Using phase-modulation is particularly advantageous when square wave switching functions are not being used to drive the transformer. This is because the piezoelectric transformer operates most efficiently with sine waves. Moreover, one input of the piezoelectric transformer can be designed to self-oscillate using a simple and efficient circuit while a second signal can be phase shifted in a separate phase shifter circuit to drive a second input. It should be recognized that in a transformer power converter circuit there is a trade-off as to the efficiencies of all the individual components, including the piezoelectric transformer, the input circuit and the output circuit. Because the input and output circuits are typically less efficient than the piezoelectric transformer, using a pulse-position-modulated switching circuit for the input circuit, to maximize overall power conversion efficiency, is preferred. However, the phase-modulated sine-wave embodiment can be more useful in applications requiring maximum piezoelectric transformer efficiency.

FIG. 1 shows a block diagram of a first embodiment of a simplified transformer circuit 10 using a piezoelectric transformer 12 having piezoelectrically interfering multiple-input driving sections, in accordance with the present invention. The transformer circuit 10 includes an input circuit 14 providing at least two driving signals, $V_{in1}$ 18 and $V_{in2}$ 20, having an adjustable phase relationship therebetween. The driving signals 18, 20 are at a substantially resonant frequency of the piezoelectric transformer 12 and are applied to the driving sections such that an adjustment in the phase relationship between the driving signals 18, 20 causes a corresponding adjustment in gain at an output, $V_{out}$ 22, of the piezoelectric transformer 12.

Typically, the transformer circuit 10 also includes an output circuit 16 providing a predetermined load impedance to the output of the piezoelectric transformer. Depending on the application to be met, one of several known output circuits can be provided. First, the output of the piezoelectric transformer may be used to drive an AC device directly, without using any specific intervening components. However, in general, some type of specific output circuit 16 is required. Typically, a DC rectifier circuit is used to provide a DC output. Furthermore, an impedance matching circuit would be required to match an optimum operating load impedance of the piezoelectric transformer to a particular customer application input impedance. Techniques for providing the various output circuits 16 described above are known in the art and will not be presented here.

Figure 2A:
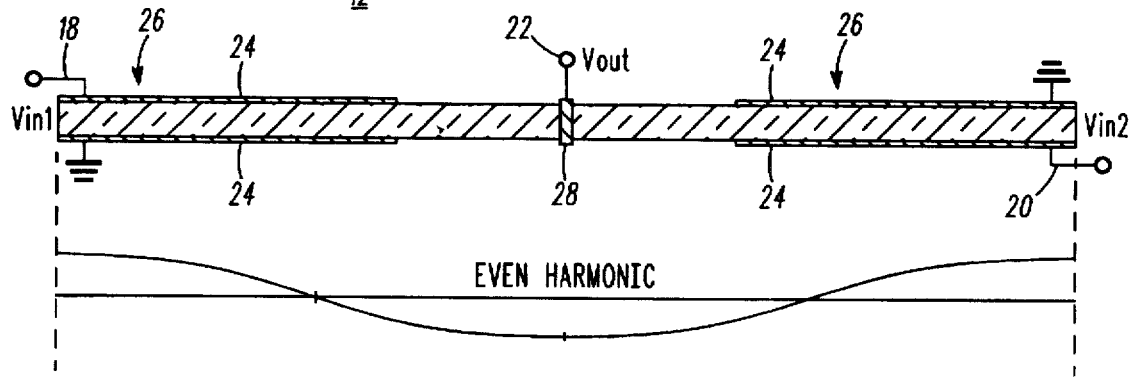
FIGS. 2A and 2B are side views of an extensional mode piezoelectric transformer used in the circuit of FIG. 1, in accordance with the present invention.
Figure 2B:
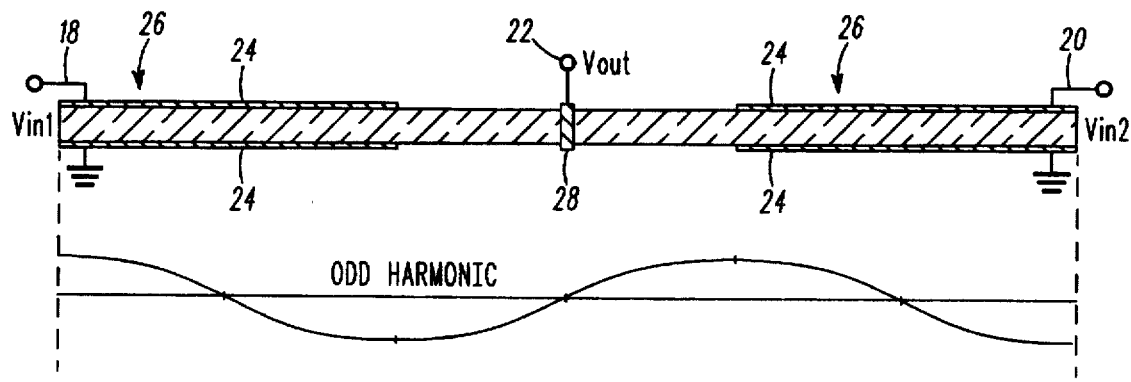

FIGS. 2A and 2B are side views of piezoelectric transformers 12 each having an extensional mode of vibration used in the transformer circuit 10 of FIG. 1. Each piezoelectric transformer 12 is shown having a piezoelectric plate with two sets of opposing driving electrode pairs 24 defining two driving sections 26 of the piezoelectric transformer 12. In addition, the plate has at least one substantially non-electroded section which is terminated by at least one output electrode 28 defining an output 22, $V_{out}$, of the piezoelectric transformer 12. The driving sections 26 are driven in a thickness extensional mode while the non-electroded section is driven in a length extensional mode.

The piezoelectric transformer of FIG. 2A is operated in an even harmonic mode as shown in the associated graphical representation. A transformer of this type typically has a singularly polarized plate (such as for single crystal types of lithium niobate or singularly polarized ceramic). The piezoelectric transformer of FIG. 2B is operated in an odd harmonic mode as shown in the associated graphical representation. A transformer of this type typically has an oppositely polarized sections of the plate (such as modified Rosen types known in the art).

For operation in an even harmonic mode (extensional wavelengths in multiples of $1\lambda$), a maximum output for $V_{out}$ is obtained when the electrical connections for $V_{in1}$ and $V_{in2}$ have the same polarity with $V_{in1}$ and $V_{in2}$ being in phase, as shown in FIG. 2A. For operation in an odd harmonic mode (extensional wavelengths in multiples of $\lambda/2$), a maximum output for $V_{out}$ is obtained when the electrical connections for $V_{in1}$ and $V_{in2}$ have the opposite polarity with $V_{in1}$ and $V_{in2}$ being in phase, as shown in FIG. 2B. Alternatively, if $V_{in1}$ and $V_{in2}$ are out of phase, the polarity of the electrical connections can be reversed to obtain maximum output for $V_{out}$. Those skilled in the art can manipulate the plate polarities and directions and whether $V_{in1}$ and $V_{in2}$ are relatively in-phase or out-of-phase, and can compensate for those changes by configuring the electrical connection polarities to be one of those represented in FIGS. 2A or 2B, without departing from the scope of the present invention.

In addition, it should be recognized that all transformer types with interfering input or output sections can be utilized in the present invention. Various piezoelectric transformers having multiple inputs and/or outputs have been described in the art. The first embodiment of the present invention can be successfully utilized for these prior art designs where the input or output sections of the particular piezoelectric transformer design are electrically independent and vibrationally interfering.

Figure 3:
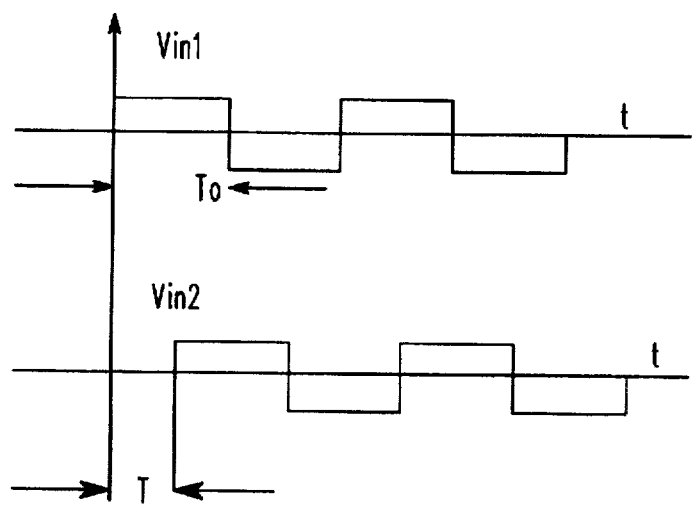
FIG. 3 shows pulse-position-modulated waveforms for driving inputs of the piezoelectric transformers of FIGS. 2A and 2B, in accordance with the present invention.

FIG. 3 shows pulse-position-modulated waveforms, $V_{in1}$ and $V_{in2}$, for driving the respective driving sections of the piezoelectric transformers of FIGS. 2A or 2B. $V_{in1}$ and $V_{in2}$ have a period of $2T_0$ and $V_{in2}$ has a variable phase shift, T, with respect to the phase of $V_{in1}$. Preferably, the period $2T_0$ is selected to be substantially equivalent to the period of the resonant frequency of the piezoelectric transformer. More preferably, the duty cycle of $V_{in1}$ and $V_{in2}$ is chosen to be about fifty percent.

Figure 4:
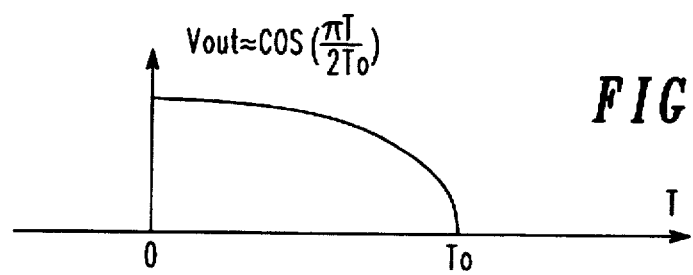
FIG. 4 shows a graphical representation of an output gain of the piezoelectric transformers of FIGS. 2A and 2B when driven with the pulse-position-modulated waveforms of FIG. 3 over a range of phase shifts, in accordance with the present invention.

FIG. 4 shows a graphical representation of the output gain, $V_{out}$, of the piezoelectric transformers of FIGS. 2A or 2B when driven with the pulse-position-modulated waveforms, $V_{in1}$ and $V_{in2}$, of FIG. 3 over a range of phase shifts from zero to $\pi$ (180°) relative phase shift. $V_{out}$ approximates a cosine function having a period of ($2T_0$) which is responsive to the relative phase difference, T, of the driving signals. At zero (or integral multiples of 360°) relative phase shift, $V_{in1}$ and $V_{in2}$ are in phase and $V_{out}$ is maximum. At $\pi$ (180°) or integral multiples of 360°$\pm\pi$ (180°) relative phase shift, $V_{in1}$ and $V_{in2}$ are out-of-phase and $V_{out}$ is a minimum. With in-between phase shifts, $V_{out}$ approximately follows the cosine function as shown.

Figure 5:
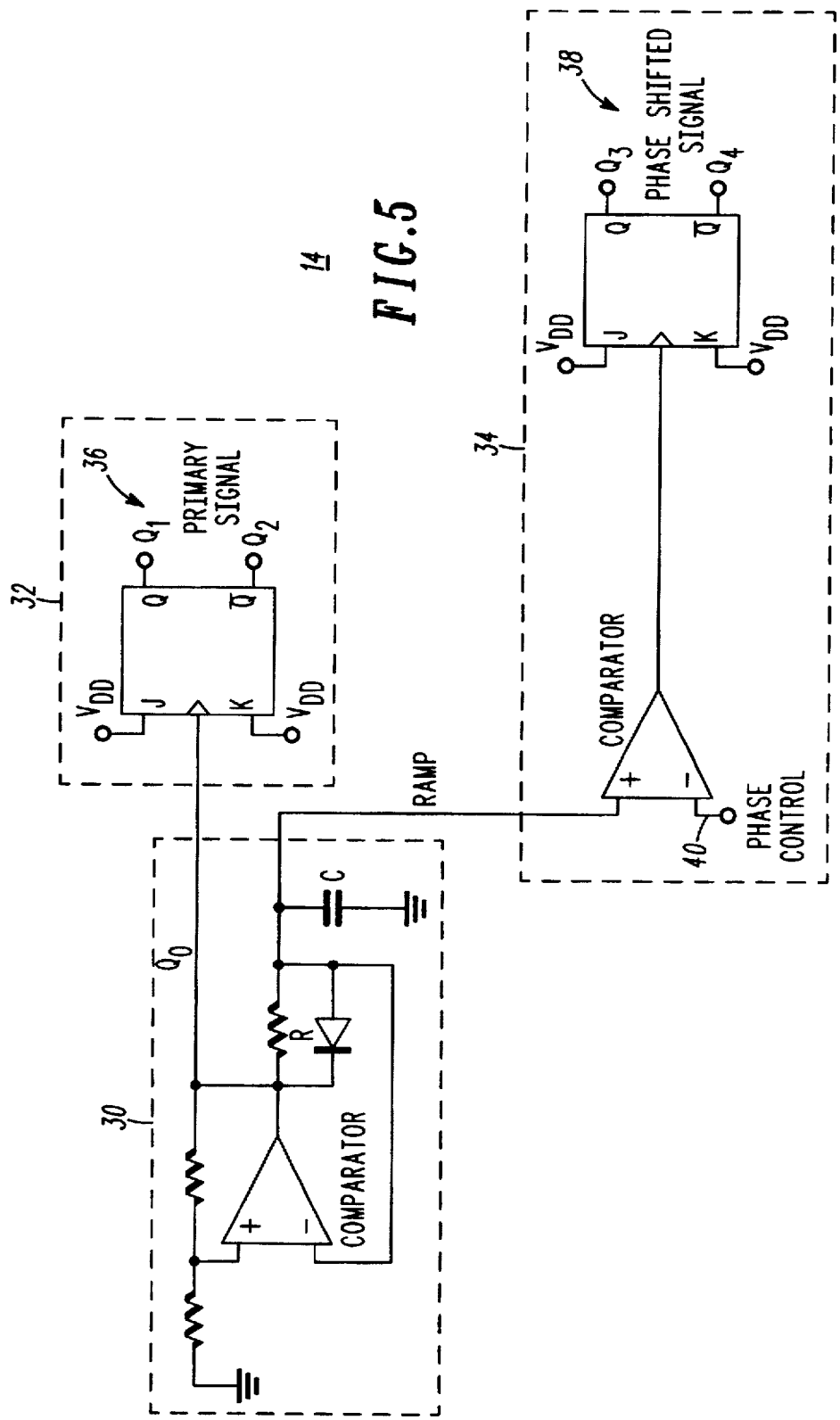
FIG. 5 is a detailed circuit diagram of an input circuit of the transformer circuit of FIG. 1 which produces driving signals $Q_1$, $Q_2$, $Q_3$ and $Q_4$, in accordance with the present invention.
Figure 6:
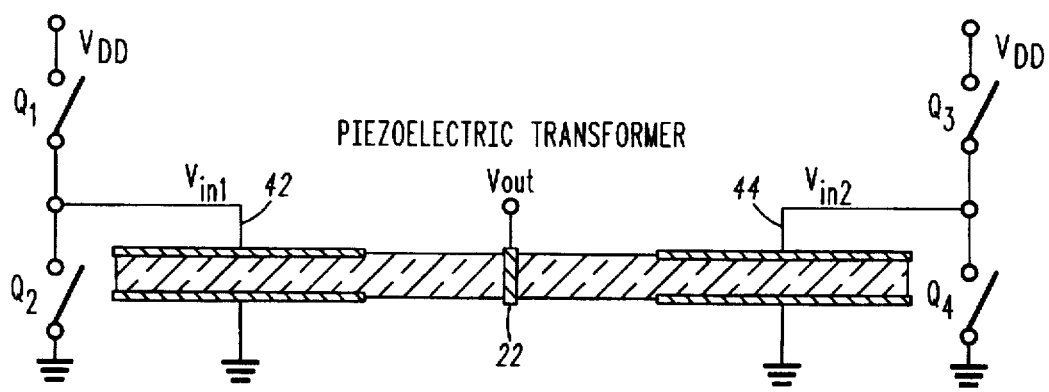
FIG. 6 is a schematic diagram showing the driving signals of the input circuit of FIG. 5 being used to drive the inputs of the piezoelectric transformer of FIG. 2, in accordance with the present invention.

FIG. 5 is a detailed circuit diagram of a preferred embodiment of the input circuit 14 of the transformer circuit 10 of FIG. 1. The input circuit 14 provides a primary signal 36 and a phase shifted signal 38 to switches which drive inputs of a piezoelectric transformer (as represented in FIG. 6).

Preferably, the signals 36, 38 are substantially fifty percent duty cycle square-waves that are offset by a relative phase shift determined by an external phase control 40. The input circuit 14 includes a sawtooth generator 30, a primary signal generator 32 and a phase shift generator 34, and produces the primary signal 36 ($Q_1$ and $Q_2$) and the phase shifted signal 38 ($Q_3$ and $Q_4$) which are applied to inputs of a piezoelectric transformer (as represented in FIG. 6).

The sawtooth generator 30 includes a self-oscillating comparator circuit which outputs a ramp signal and a square wave signal, $Q_0$. A voltage divider is coupled to a non-inverting input of the comparator and is driven from an output of the comparator. The output of the comparator is coupled to a series resistor, R, and a shunt capacitor, C. The frequency of the signals is determined by the RC time constant of the series resistor and shunt capacitor. The values of R and C are chosen to produce a frequency which corresponds to about double of a resonant frequency of the piezoelectric transformer. It should be recognized that at least one of R and C can be made variable and externally controllable using techniques that are known in the art. The ramp signal is provided at a junction of R and C. The ramp signal is also coupled back to an inverting input of the comparator and to the output of the comparator through a diode.

The primary signal generator 32 is a JK flipflop. The J and K leads of the flipflop are held high. A clock input of the flipflop is provided with the square wave signal, $Q_0$, from the output of the comparator of the sawtooth generator 30. The JK flipflop outputs the primary signal 36 which has a substantially fifty percent duty cycle at one-half of the frequency of $Q_0$ which corresponds to a resonant frequency of the piezoelectric transformer.

The phase shift generator 34 includes a comparator and a JK flip flop. The J and K leads of the flipflop are held high. The comparator compares the ramp signal from the sawtooth generator 30, connected to a non-inverting input, with the phase control 40, connected to an inverting input, to create a variable output signal from the comparator. The comparator output is then coupled to a clock input of the JK flipflop which outputs the phase shifted signal 38 which has a substantially fifty percent duty cycle at about one-half of the frequency of $Q_0$.

FIG. 6 is a schematic diagram showing how the primary and phase shifted signals $Q_1$, $Q_2$, $Q_3$ and $Q_4$ of the input circuit of FIG. 5 are used to drive switches which provide the driving signals, $V_{in1}$ and $V_{in2}$, to inputs of the even harmonic piezoelectric transformer of FIG. 2A, as shown. It should be noted that the $Q_3$ and $Q_4$ switches should be interchanged to provide the correct polarity driving signals, $V_{in1}$ and $V_{in2}$, to inputs of the odd harmonic piezoelectric transformer of FIG. 2B. The switches are preferably transistor switches. Many switch configurations are known in the art, any of which being equally applicable for use in the present invention.

Figure 7:
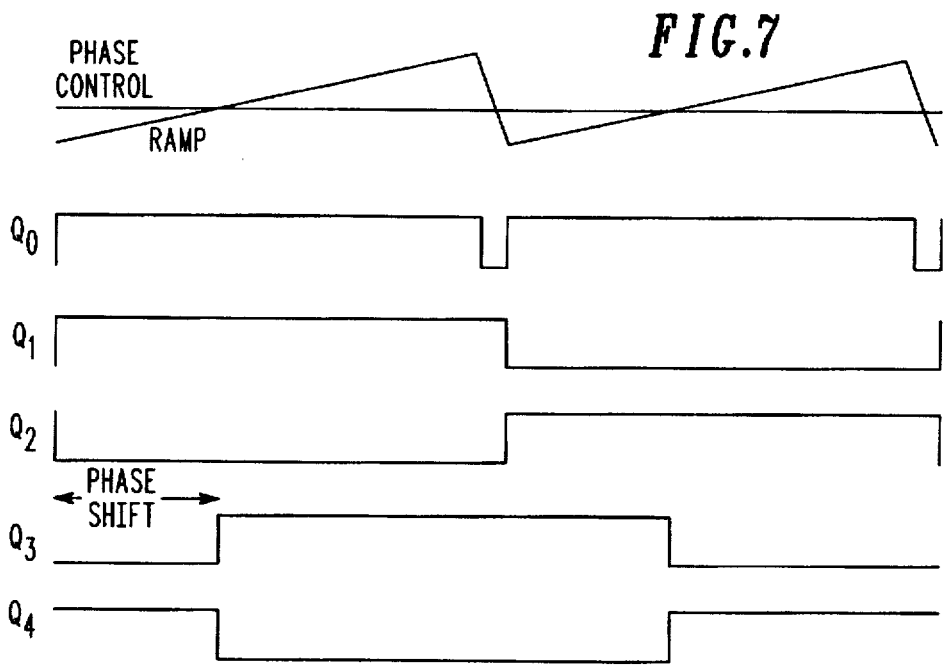
FIG. 7 shows waveforms for use in describing the operation of the input circuit of FIGS. 5 and 6, in accordance with the present invention.

FIG. 7 shows waveforms for use in describing the operation of the input circuit 14 and piezoelectric transformer switches of FIGS. 5 and 6. The first and second waveforms shows the sawtooth ramp waveform and comparator output, $Q_0$, provided by the sawtooth generator 30. When the comparator of the sawtooth generator 30 generates a high output ($Q_0$ is high) the capacitor, C, charges through the resistor, R, forming an increasing ramp voltage. As the ramp voltage crosses a threshold defined by the voltage divider on a non-inverting input of the comparator, the output of the comparator goes low ($Q_0$ is low). This causes the capacitor, C, to quickly discharge through the diode, and the cycle begins again. The values of R and C are predetermined to provide a period substantially equivalent to one-half of a period of a resonant frequency of the piezoelectric transformer.

The comparator output, $Q_0$, is applied to a clock input of the JK flipflop of the primary signal generator 32. The J and K input of the JK flipflop of the primary signal generator 32 are kept high. This causes the Q output of the JK flipflop to change states on every leading edge of the clock signal, $Q_0$. In effect, this produces a square-wave, substantially fifty percent duty cycle signal with about half the frequency of $Q_0$ which is substantially equivalent to the resonant frequency of the piezoelectric transformer. This signal, $Q_1$, is applied to a switch coupled between a first input 42 to the piezoelectric transformer and $V_{DD}$. The JK flipflop also outputs $Q_2$, a complementary signal to Q, which is the opposite polarity of $Q_1$. This signal, $Q_2$, is applied to a switch coupled between a first input 42 to the piezoelectric transformer and ground. As $Q_1$ goes high, the corresponding switch to $V_{DD}$ closes (and the switch to ground opens since $Q_2$ goes low) and drives the first input 42 of the piezoelectric transformer, $V_{in1}$, high. The resulting signal, $V_{in1}$, has a frequency corresponding to $Q_1$ and the resonant frequency of the piezoelectric transformer.

The ramp signal from the comparator of the sawtooth generator 30 is applied to a non-inverting input of a comparator of the phase shift generator 34 and is compared to the phase control coupled to the inverting input of the comparator. The output of the comparator is coupled to a clock input of a JK flipflop of the phase shift generator 34. The J and K input of the JK flipflop of the phase shift generator 34 are kept high. This causes the Q output of the JK flipflop to change states on every leading edge of the comparator output. As the ramp signal crosses the threshold of the phase control the output of the comparator goes high causing the Q output to go high. In effect, this produces a square-wave, substantially fifty percent duty cycle signal with about half the frequency of the comparator output which is equivalent to the resonant frequency of the piezoelectric transformer. This signal, $Q_3$, is applied to a switch coupled between a second input 44 to the piezoelectric transformer and $V_{DD}$. The JK flipflop also outputs $Q_4$, a complementary signal to $Q_3$, which is the opposite polarity of $Q_3$. This signal, $Q_4$, is applied to a switch coupled between a second input 44 to the piezoelectric transformer and ground. As $Q_3$ goes high, the corresponding switch to $V_{DD}$ closes (and the switch to ground opens since $Q_4$ goes low) and drives the second input 44 of the piezoelectric transformer, $V_{in2}$, high. The resulting signal, $V_{in2}$, has a frequency corresponding to $Q_3$ and the resonant frequency of the piezoelectric transformer.

The signals, $Q_1$, $Q_2$, $Q_3$ and $Q_4$, all have the same frequency corresponding to the resonant frequency of the piezoelectric transformer. However, the signals $Q_3$ and $Q_4$ are phase shifted from $Q_1$ and $Q_2$ by time period equal to the time taken by the ramp signal to cross the phase control threshold. As the phase control threshold is increased, the time for the ramp signal to cross it increases. This correspondingly increases the relative phase shift between $V_{in1}$ and $V_{in2}$. The advantage of the particular circuit configurations of FIGS. 5 and 6 is that the phase shifted signal 38 can be adjusted continuously between 0° and 180° relative to the primary signal 36 which provides control of the piezoelectric transformer output 22 without changing the duty cycle of the switches.

Figure 8:
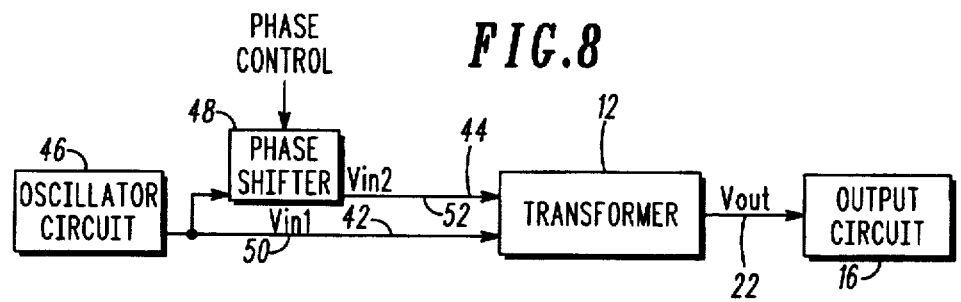
FIG. 8 is a block diagram of a second embodiment of a simplified transformer circuit using phase-modulated sine waveforms for driving the inputs of the piezoelectric transformers of FIGS. 2A and 2B, in accordance with the present invention.

FIG. 8 is a block diagram of a second embodiment of a simplified transformer circuit using phase-modulated sine waveforms for driving the inputs of the piezoelectric transformer of FIG. 2. In this, embodiment, the input circuit (shown as 14 in FIG. 1) is replaced by an oscillator circuit 46 and a phase shifter 48. A first input 42 of the transformer 12 is driven by a sinewave 50, $V_{in1}$, produced by the oscillator circuit 46 at a resonant frequency of the piezoelectric transformer 12. It should be recognized that there are many oscillator circuits known in the art and any of them can be successfully implemented in the present invention. The sinewave 50, $V_{in1}$, is also applied to a variable phase shifter 48 controlled by an external phase control. The phase shifter 48 provides a second sinewave 52, $V_{in2}$, which is substantially identical to $V_{in1}$ but having a relative phase shift responsive to the phase control. This second sinewave 52, $V_{in1}$, is applied to a second input 44 of the piezoelectric transformer. The phase shifted signal, $V_{in2}$, can be adjusted continuously between 0° and 180° relative to the oscillator signal, $V_{in1}$, which provides control of the piezoelectric transformer output 22 in the previously described manner.

In an alternative second embodiment, a first input 42 of the transformer 12 self-oscillates with the oscillator circuit 46 at a resonant frequency of the piezoelectric transformer 12. It should be recognized that there are many crystal oscillator circuits known in the art, such as a Colpitts design, which can be successfully implemented in the present invention to self-oscillate with the first input 42. The advantage of providing self-oscillation is that the oscillator circuit 46 is self-tuning to track the resonant frequency of the piezoelectric transformer. Advantageously, this results in a simpler and lower cost circuit topology.

Figure 9:
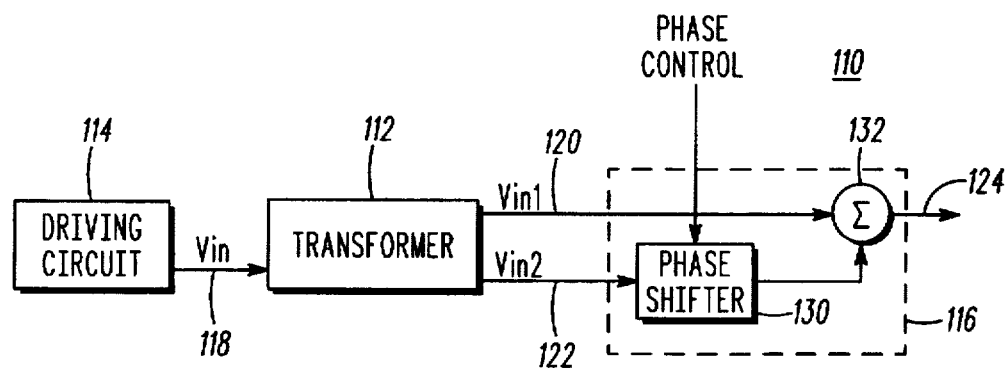
FIG. 9 is a block diagram of a third embodiment of a simplified transformer circuit for driving a single input of a piezoelectric transformer which supplies two outputs having an adjustable phase relationship which are summed, in accordance with the present invention.

FIG. 9 shows a block diagram of a third embodiment of a simplified transformer circuit 110 using a piezoelectric transformer 112 having electrically interfering multiple-output driving sections that are phase-modulated, in accordance with the present invention. The transformer circuit 110 includes an driving circuit 114 providing a driving signal 118, $V_{in1}$, coupled to a driving section of the piezoelectric transformer 112 and being at a resonant frequency of the piezoelectric transformer 112. The piezoelectric transformer 112 provides two output signals, $V_{out1}$ 120 and $V_{out2}$ 122, to an output circuit 116. The output circuit 116 adjusts a relative phase between $V_{out1}$ 120 and $V_{out2}$ 122 which is subsequently summed. The phase relationship between $V_{out1}$ 120 and $V_{out2}$ 122 causes a corresponding adjustment in gain at an output 124 of the circuit 110 responsive to a phase control signal.

Optionally, the output circuit 116 provides a predetermined load impedance to the outputs of the piezoelectric transformer 112. In addition, impedance matching circuits can be used to match an optimum operating load impedance of the piezoelectric transformer to a particular customer application. The output circuit 116 can be used to drive an AC device directly, without using any intervening rectifying components. Alternatively, the transformer circuit 110 can also include a rectifying circuit coupled to the output circuit 116 to provide a DC output. Depending on the application to be met, one of several known rectifying circuits can be provided. Techniques for providing rectifying circuits are known in the art and will not be presented here.

In a preferred embodiment, the output circuit 116 includes a phase shifter 130 and a summing circuit 132 each of which is coupled to and provides a predetermined load impedance to the respective outputs, $V_{out1}$ 120 and $V_{out2}$ 122, of the piezoelectric transformer 112. The phase shifter 130 is of a similar configuration as the phase shifter 48 of FIG. 5. Summing circuits are known in the art and can include a differential amplifier or phase comparator, for example. The phase shifter 130 provides a adjustable phase shifted $V_{out2}$ signal to the summing circuit 132 to be summed with $V_{out1}$ 120 to provide an adjustable gain output 124 responsive to the phase control.

Figure 10:
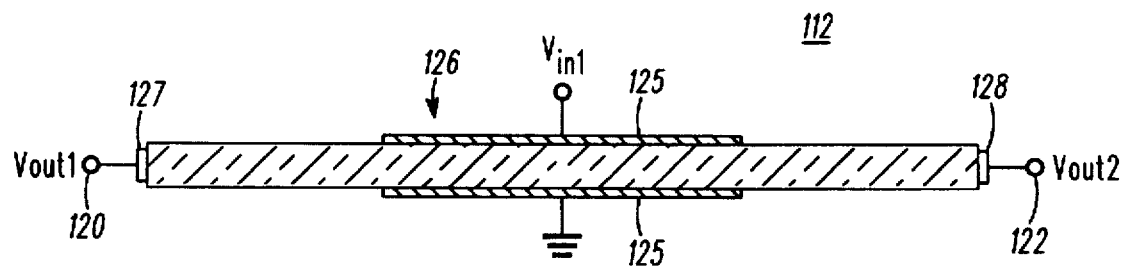
FIG. 10 is a side view of a piezoelectric transformer used in the transformer circuit of FIG. 9, in accordance with the present invention.

FIG. 10 is a side view of the piezoelectric transformer 112 having an extensional mode of vibration and used in the transformer circuit 110 of FIG. 9. The piezoelectric transformer 112 is shown having a piezoelectric plate with one set of opposing driving electrode pairs 125 defining a driving sections 126 of the piezoelectric transformer 112. In addition, the plate has at least two substantially non-electroded section which are terminated by at least a first and second respective output electrode 127, 128 defining two outputs 120, 122, $V_{out1}$ and $V_{out2}$ of the piezoelectric transformer 112. The driving section 126 is driven in a thickness extensional mode while the non-electroded sections are driven in a length extensional mode.

The advantage of this third embodiment is that the driving circuit 114 (of FIG. 9) can be an oscillator design which self-oscillates with the input section 126 at a resonant frequency of the piezoelectric transformer 112. It should be recognized that there are many crystal oscillator circuits known in the art, such as a Colpitts design, which can be successfully implemented in the present invention to self-oscillate with the input section 126. The advantage of providing self-oscillation is that the driving circuit 114 is self-tuning to track the resonant frequency of the piezoelectric transformer 112. Advantageously, this results in a simpler and lower cost circuit topology with electrically independent input and output circuits.

The piezoelectric transformer of FIG. 10 can be of an even or odd harmonic operation with $V_{out1}$ and $V_{out2}$ having any relative phase relationship. However, the simplest operation of the circuit would occur with $V_{out1}$ and $V_{out2}$ being substantially in-phase or substantially out-of-phase to produce a maximum or minimum output 124. For either condition, the output circuit 116 adjusts the relative phase between $V_{out1}$ and $V_{out2}$ within the range of being substantially in-phase through being substantially out-of-phase. Those skilled in the art can manipulate the plate polarities and directions and whether $V_{out1}$ and $V_{out2}$ are relatively in-phase or out-of-phase, and can compensate for those changes by proper configuring the electrical connection polarities, without departing from the scope of the present invention.

In addition, it should be recognized that all transformer types with multiple output sections can be utilized in the present invention. Various piezoelectric transformers having multiple outputs have been described in the art. This third embodiment of the present invention can be successfully utilized for these designs where the input or output sections of the particular piezoelectric transformer design are electrically independent and vibrationally interfering.

In an alternate third embodiment, the output circuit includes a switching circuit with the multiple outputs of the piezoelectric transformer being switchably connected to a load through the switching circuit. A switching signal drives the switching circuit at a resonant, subharmonic, or multiple of the resonant frequency such that a relative phase difference between the output signals causes a corresponding adjustment of gain at the load. Preferably, the output signals retain substantially fifty percent duty cycles.

In a fourth embodiment of the present invention, at least two input sections and at least two output sections are provided on a piezoelectric transformer. This embodiment encompasses a combination of the second and third embodiments and includes at least two inputs, $V_{in1}$ and $V_{in2}$, being provided having a first adjustable phase relationship therebetween, and at least two output, $V_{out1}$ and $V_{out2}$, being provided having a second adjustable phase relationship therebetween. The second adjustable phase relationship being independently adjustable from the first adjustable phase relationship.

The present invention also includes a first method for driving multiple-input transformers, such as the ones shown in FIGS. 2A and 2B, for example. This first method comprises the steps of: driving a first driving section with a first driving signal at about a resonant frequency of the plate, and driving a second driving section with a second driving signal at about a resonant frequency of the plate, but with the second driving signal having an adjustable phase relationship relative to the first driving signal such that an output signal obtained from at least one output electrode demonstrates a correspondingly adjustable gain. The adjustment in the phase relationship between the driving signals causes vibrational interference within the transformer such that an adjustment in gain corresponding to a cosine function responsive to a phase difference between the driving signals is produced at an output of the piezoelectric transformer. The driving signals may be of any arbitrary waveform including a square waveform, a sine waveform, a triangular waveform, a sawtooth waveform, and an irregular waveform. Preferably, the first and second driving signals have a substantially fifty percent duty cycle.

In addition, the both driving signals should have substantially the same waveshape and amplitude for most efficient operation.

Using the electrical connections for the transformer example shown in FIG. 2A, driving the first and second inputs (shown as 18 and 20) with the same in-phase signal produces a maximum gain at the output electrode. Driving the inputs with 180° out-of-phase signals produces a minimum gain at the receiving electrode. Driving the first driving section about 90° out-of-phase from the second driving section produces about $1/\sqrt{2}$ of the potential maximum gain at the output electrode.

Using a substantially resonant frequency for driving both inputs has the advantage of always operating the piezoelectric transformer at its most efficient frequency. Driving the driving sections of FIG. 2A with similar in-phase signals produces the maximum gain and power transfer, as expected. Driving the driving sections with out-of-phase signals produces the minimum gain and power transfer. Surprisingly however, when the two driving sections are operated out-of-phase very little power is dissipated internally by the transformer as waste heat since the input impedance of the transformer rises correspondingly as the relative phase difference is maximized.

The present invention also includes a second method for driving multiple-output transformers, such as the one shown in FIG. 10, for example. This second method comprises the steps of: driving an input section of the piezoelectric transformer with a driving signal at about a resonant frequency of the plate, phase shifting a second output signal from a second output section of the piezoelectric transformer relative to a first output signal from a first output section, summing the first and second output signals such that a resultant summed output signal demonstrates adjustable gain responsive to a relative phase between the first and second output signals. The adjustment in the phase relationship between the output signals causes interference between the output signals in the summing step such that an adjustment in gain in the summed output signal corresponds to a cosine function responsive to a phase difference between the output signals. The driving signal may be of any arbitrary waveform including a square waveform, a sine waveform, a triangular waveform, a sawtooth waveform, and an irregular waveform. Preferably, the driving signal provide a provides a substantially fifty percent duty cycle to the input section. More preferably, the driving signal self-resonates with the input section to provide a more efficient sinewave input.

Those skilled in the art should recognize that, using the electrical connections for the transformer example shown in FIG. 10, and with the transformer operating in an odd harmonic mode the output signals can be substantially in-phase or out-of-phase depending on the initial poling of the transformer plate. In either case, summing 180° out-of-phase output signals produces a minimum gain for the summed output, and summing in-phase output signals produces a maximum gain for the summed output. Phase shifting a second output signal to be about 90° out-of-phase from a first output signal produces a summed output of about $1/\sqrt{2}$ of the potential maximum gain.

Using a substantially resonant frequency for driving the input section has the advantage of always operating the piezoelectric transformer at its most efficient frequency which produces the maximum power transfer. The advantage of this second method is that the transformer input may be sinewave driven by a self-oscillating input circuit which is more efficient than being driven by a switching input circuit. This, in turn, negates the need for input signal frequency tracking or feedback since the driving signal automatically tracks the resonant frequency of the transformer. In addition, the output signals interfere outside of the transformer which further reduces internal heating within the transformer.

EXAMPLE

In addition to the transformer configurations presented in FIGS. 2A, 2B and 10, other possible transformer embodiments which can be utilized in this application are presented in U.S. Pat. No. 5,365,141 to Kawai et al., U.S. Pat. No. 5,440,195 to Ohnishi et al., and U.S. Pat. No. 5,463,266 to Fukuoka et al., all of which have dual-input piezoelectric transformers embodiments, for example. For the present invention, the exact configuration of electrodes or the piezoelectric material used in the piezoelectric transformer is immaterial in the operation of the invention as long as at least two independent and interfering inputs or outputs are used.

The design of the transformer tested in this example included an elongated singularly polarized piezoelectric crystal plate of 135° Y-cut lithium niobate having dimensions of about: 20 mm in length, 4 mm in width and 0.4 mm in thickness. The plate has a piezoelectric oscillating mode having an even number of substantially one-half resonance wavelengths of an extensional mode oscillation in a length direction of the plate. The plate has a first substantially opposing driving electrode pair disposed near a first end of the plate and defining a first driving section, and a second substantially opposing driving electrode pair disposed near a second end of the plate and defining a second driving section, substantially as shown in FIG. 2A. The input electrode pairs were about 4 mm in width and 5 mm (about one-half wavelength) in length.

The plate has a substantially non-electroded region at a central portion of the plate defining an output section and being terminated by at least one output electrode of about 1 mm in width deposited in a band around the central portion of the plate. The plate was operated at a fourth harmonic frequency (two wavelengths) of 590 kHz although operation at any even harmonic frequency is possible. The vibrational nodes and mounting supports of the plate were located at one-quarter wavelength in from either end of the plate. It should be recognized that the performance of the transformer is optimized when mounting supports are located at a vibrational node so as to minimize any damping of the piezoelectric vibrations of the plate.

Figure 11:
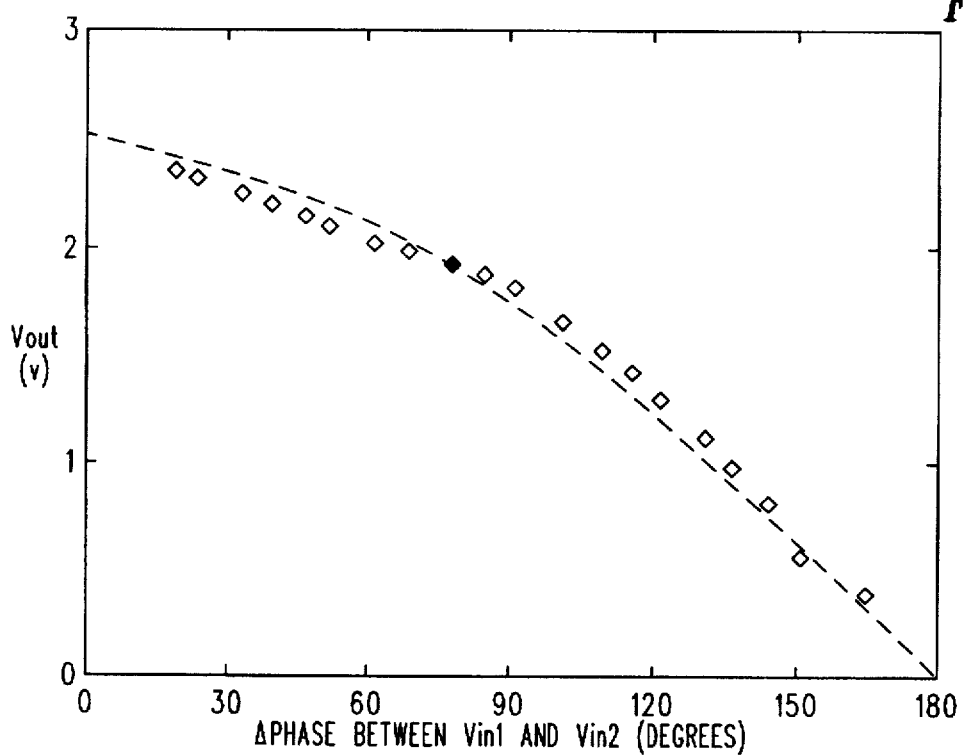
FIG. 11 shows a graphical representation of theoretical and experimental data of output voltage versus phase difference between $V_{in1}$ and $V_{in2}$ using the pulse-position-modulation circuit of FIG. 8, in accordance with the present invention.

FIG. 11 shows a graphical representation of theoretical and experimental data of the piezoelectric transformer output voltage, $V_{out}$, versus phase difference between $V_{in1}$ and $V_{in2}$ using the circuit FIG. 8. The dotted line represents the calculated cosine output voltage, $V_{out}$, for a given phase difference between $V_{in1}$ and $V_{in2}$. The data points represent the actual output voltages for a given phase difference between $V_{in1}$ and $V_{in2}$. As can be seen, the experimental data agree quite well with the calculated plot.

Figure 12:
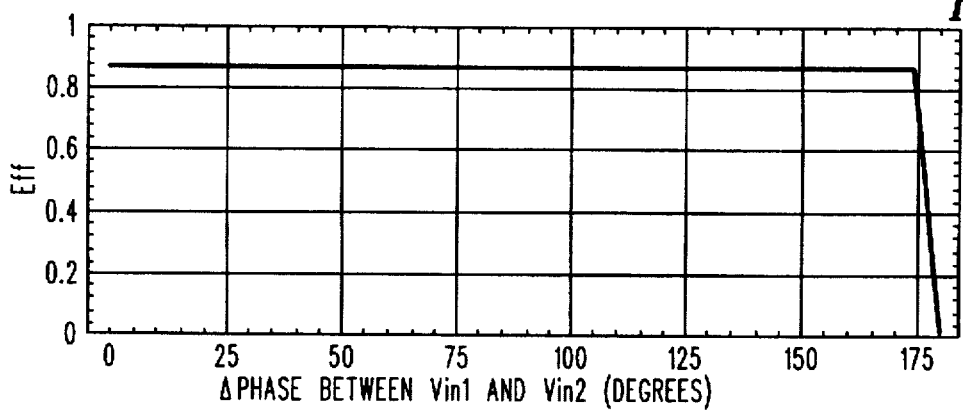
FIG. 12 shows a graphical representation of efficiency of the piezoelectric transformer versus phase difference between $V_{in1}$ and $V_{in2}$ using the pulse-position-modulation circuit of FIG. 8, in accordance with the present invention.

FIG. 12 shows a graphical representation of efficiency of the piezoelectric transformer versus phase difference between $V_{in1}$ and $V_{in2}$ using the circuit of FIG. 8. The graph shows that the present invention advantageously maintains efficiency substantially throughout the useful phase adjustment range. Correspondingly, efficiency is maintained over the usable gain adjustment range as shown in FIG. 11.

Figure 13:
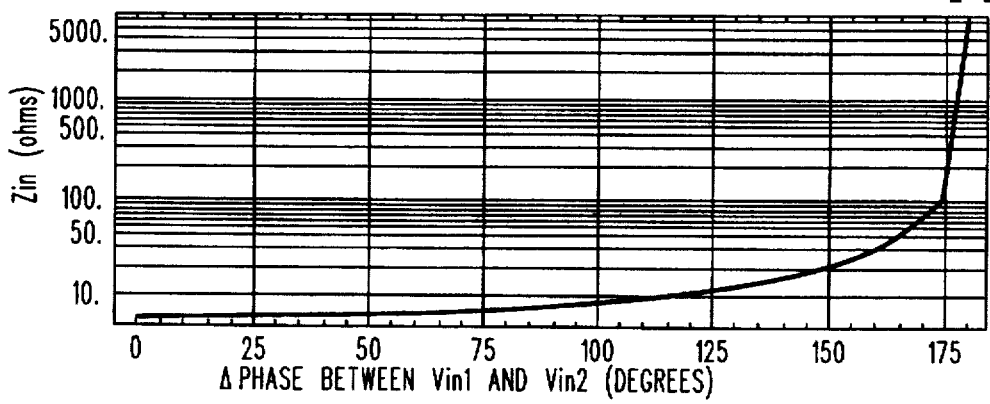
FIG. 13 shows a graphical representation of input impedance of the piezoelectric transformer versus phase difference between $V_{in1}$ and $V_{in2}$ using the pulse-position-modulation circuit of FIG. 8, in accordance with the present invention.

FIG. 13 shows a graphical representation of input impedance of the piezoelectric transformer versus phase difference between $V_{in1}$ and $V_{in2}$ using the circuit of FIG. 8.

The graph shows that as gain (as shown in FIG. 11) is reduced through interfering piezoelectric vibrations from the two inputs of the piezoelectric transformer, the input impedance, $Z_{in}$, of the transformer advantageously increases which reduces current and power draw within the transformer. Therefore, any waste heat that might potentially be produced within the transformer is minimized.

Table 1 show a table of power consumption for in-phase constructive (maximum gain) and out-of-phase destructive (minimum gain) driving conditions for the piezoelectric transformer. For both the constructive and destructive driving cases represented in Table 1, the driving input voltage was 6 volts peak-to-peak and the output circuit was a load resistor of 13 kohms. $P_{in}$ is the input power to the transformer while $P_{out}$ is the output power delivered by the transformer. $V_{out}$ is the output voltage provided by the transformer.

TABLE 1

| Gain Change Between 0° and 180° Phase Shifts | | | |
|---|---|---|---|
| Mode | $P_{in}$ | $P_{out}$ | $V_{out}$ |
| Constructive | 87.6 mW | 38.8 mW | 63.5 V |
| Destructive | 9.0 mW | 0.4 mW | 6.6 V |

As can be seen, the output power, $P_{out}$, varies greatly (about a factor of 100) between the two gain extremes. Also, at full destructive interference the power dissipated within the piezoelectric transformer, 8.6 mW, is minimal even though the circuit and transformer designs were not optimized or impedance matched to the input or output circuits for this test.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A transformer circuit for driving a piezoelectric transformer having piezoelectrically interfering multiple-input driving sections, comprising:

an input circuit providing at least two driving signals having an externally controlled adjustable phase relationship therebetween, the driving signals being at a substantially resonant frequency of the piezoelectric transformer and being applied to the input driving sections such that an adjustment in the phase relationship between the driving signals causes a corresponding adjustment in gain at an output of the piezoelectric transformer, the transformer maintaining operating efficiency over substantially a full range of gain adjustments; and an output circuit coupled with the output of the transformer.

2. The transformer circuit of claim 1, wherein the driving signals have a substantially fifty-percent duty cycle.

3. The transformer circuit of claim 1, wherein the input circuit is a switching circuit providing pulse-position-modulated driving signals to the driving sections of the piezoelectric transformer.

4. The transformer circuit of claim 1, wherein the input circuit is an oscillating circuit providing phase-modulated driving signals to the driving sections of the piezoelectric transformer using substantially sine-wave driving signals.

5. The transformer circuit of claim 4, wherein the input circuit includes an oscillator circuit, a first driving section of the piezoelectric transformer is allowed to self-oscillate with the oscillator circuit at a substantially resonant frequency, and further comprising an adjustable phase-shifting circuit responsive to a phase control, the phase-shifting circuit adjustably phase-shifting a driving signal from the oscillator circuit and applying the phase-shifted driving signal to a second driving section of the piezoelectric transformer.

6. The transformer circuit of claim 1, further comprising an output circuit providing a predetermined load impedance to the output of the piezoelectric transformer.

7. The transformer circuit of claim 1, wherein the output of the piezoelectric transformer corresponds to a cosine function responsive to a phase difference between the driving signals.

8. The transformer circuit of claim 1, wherein an input impedance of the piezoelectric transformer is responsive to a phase difference between the driving signals of the input circuit.

9. A transformer circuit for driving a piezoelectric transformer having multiple-output sections, comprising:

an input circuit providing a driving signal of about a fifty percent duty cycle to an input section of the transformer at a substantially resonant frequency of the transformer;

an output circuit providing an adjustable phase shift to a second output signal from the transformer relative to a first output signal from the transformer, the output circuit also summing the first and second output signals such that a resultant summed output signal demonstrates adjustable gain having a cosine function responsive to a relative phase between the first and second output signals.

10. The transformer circuit of claim 9, wherein the input circuit is an oscillating circuit providing a substantially sine-wave driving signal to the input section of the piezoelectric transformer causing the input section to self-oscillate with the oscillator circuit at a substantially resonant frequency, and wherein the output circuit includes an adjustable phase-shifting circuit responsive to a phase control, the phase-shifting circuit adjustably phase-shifting the second output signal of the piezoelectric transformer relative to the first output signal.

11. The transformer circuit of claim 9, wherein the output circuit provides a predetermined load to the output signals.

12. A transformer circuit for driving a piezoelectric transformer having piezoelectrically interfering multiple-input driving sections, comprising:

a substantially sinewave oscillating input circuit providing at least two phase-modulated driving signals with a substantially fifty-percent duty cycle and having an externally controlled adjustable phase relationship therebetween, the driving signals being at a substantially resonant frequency of the piezoelectric transformer and being applied to the driving sections such that an adjustment in the phase relationship between the driving signals causes vibrational interference within the transformer resulting in a corresponding adjustment in gain at an output of the piezoelectric tranformer, the adjustment in gain corresponding to a cosine function of a phase difference between the driving signals, the transformer maintaining operating efficiency over substantially a full range of gain adjustments; and an output circuit coupled with the output of the transformer.

13. The transformer circuit of claim 12, wherein a first driving section of the piezoelectric transformer is allowed to self-oscillate with the oscillator circuit, and further comprising an adjustable phase-shifting circuit responsive to a phase control, the phase-shifting circuit adjustably phase-shifting a driving signal from the oscillator circuit and applying the phase-shifted driving signal to a second driving section of the piezoelectric transformer.

14. The transformer circuit of claim 12, wherein an input impedance of the piezoelectric transformer is responsive to a phase difference between the driving signals of the input circuit.

15. A method for driving a piezoelectric transformer having piezoelectrically interfering multiple-input driving sections, comprising the steps of:

driving a first driving section of the piezoelectric transformer with a first driving signal at about a resonant frequency of the transformer; and driving a second driving section of the piezoelectric transformer with a second driving signal at about a resonant frequency of the transformer and having an adjustable phase relationship relative to the first signal such that an output signal obtained from an at least one output electrode demonstrates a correspondingly adjustable gain.

16. The method of claim 15, wherein the driving steps include the first and second driving signals having a waveform selected form the group consisting of a square waveform, a sine waveform, a triangle waveform, a sawtooth waveform signal, and an irregular waveform.

17. The method of claim 15, wherein the driving steps include the first and second driving signals having about a fifty percent duty cycle.

18. A method for driving a piezoelectric transformer having multiple-output sections, comprising the steps of:

driving an input section of the piezoelectric transformer with a driving signal of about a fifty percent duty cycle at about a resonant frequency of the plate;

phase shifting a second output signal from a second output section of the piezoelectric transformer relative to a first output signal from a first output section of the piezoelectric transformer; and summing the first and second output signals such that a resultant summed output signal demonstrates an adjustable gain responsive to a relative phase between the first and second output signals.

19. The method of claim 18, wherein the driving step includes the input section of the piezoelectric transformer self-oscillating with a substantially sine-wave driving signal at a substantially resonant frequency.

* * * * *